（12） United States Patent
Aso

(10) Patent No.: US 8,319,677 B2
(45) Date of Patent: Nov. 27, 2012

(54) SEMICONDUCTOR INTEGRATED CIRCUIT DEVICE HAVING A/D CONVERTER WITH IMPEDANCE MATCHING CIRCUIT

(75) Inventor: Takuji Aso, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 104 days.

(21) Appl. No.: 12/900,074

(22) Filed: Oct. 7, 2010

(65) Prior Publication Data

US 2011/0084862 A1   Apr. 14, 2011

(30) Foreign Application Priority Data

Oct. 9, 2009   (JP) .................................. 2009-234717

(51) Int. Cl.
*H03M 1/38*   (2006.01)
(52) U.S. Cl. ........................................ 341/161; 341/155
(58) Field of Classification Search .................. 341/155, 341/161, 172; 330/69, 86, 260
See application file for complete search history.

(56) References Cited

U.S. PATENT DOCUMENTS

| | | | |
|---|---|---|---|
| 6,856,195 B2* | 2/2005 | Ranmuthu | 330/86 |
| 8,004,447 B2* | 8/2011 | Hsu | 341/161 |
| 8,035,622 B2* | 10/2011 | Hotelling et al. | 345/173 |
| 2005/0225471 A1 | 10/2005 | Yukawa | |

FOREIGN PATENT DOCUMENTS

JP   2005-12250   1/2005

* cited by examiner

*Primary Examiner* — Brian Young
(74) *Attorney, Agent, or Firm* — Womble Carlyle

(57) ABSTRACT

A high-precision A/D conversion is realized while the number of external terminals used for an A/D converter is reduced. At the time of sampling, first to fifth switches are turned on and a sixth switch is turned off. Since a first resistor is set to a resistance value optimum for sampling, an impedance in the direction from a node A to the left side and an impedance in the direction from a node B to the left side almost match, and a large noise-cancelling effect is obtained. At the time of successive approximation, the first, second, third, and fifth switches are turned off and the fourth and sixth switches are turned on. Since a second resistor is set to a resistance value optimum for the successive approximation, the impedance in the direction from the node A to the left side and the impedance in the direction from the node B to the left side almost match, and a large noise-cancelling effect is obtained also at the time of successive approximation.

20 Claims, 14 Drawing Sheets

SEMICONDUCTOR INTEGRATED CIRCUIT DEVICE HAVING A/D CONVERTER WITH IMPEDANCE MATCHING CIRCUIT

CROSS-REFERENCE TO RELATED APPLICATIONS

The disclosure of Japanese Patent Application No. 2009-234717 filed on Oct. 9, 2009 including the specification, drawings and abstract is incorporated herein by reference in its entirety.

BACKGROUND OF THE INVENTION

The present invention relates to a technique for improving precision of conversion of an A/D (Analog/Digital) converter and, more particularly, to a technique effective to reduce a conversion error in a semiconductor integrated circuit device on which a plurality of A/D converters are mounted.

A semiconductor integrated circuit device on which an A/D converter is mounted is widely used. For example, in a semiconductor integrated circuit device used for controlling a car or the like, there is a tendency that the number of sensors coupled to the semiconductor integrated circuit device increases, and it is desired to mount a plurality of A/D converters.

On the other hand, in a semiconductor integrated circuit device of this type, as reduction in cost and the like is desired, decrease in the number of external terminals is required. The inventors of the present invention have examined and found that, to decrease the number of external terminals of a semiconductor integrated circuit device provided with a plurality of A/D converters, a technique of sharing power supply terminals (AVCC, AVSS, REFH, and REFL) for supplying a power supply voltage, a reference voltage, and the like to the A/D converters is valid.

For example, in the case of mounting two A/D converters, when the above-described power supply terminals are not shared, four external terminals are necessary for each of the A/D converters, and total eight external terminals are necessary. Further, in the case of mounting three A/D converters, when the above-described power supply terminals are not shared, 12 external terminals are required.

SUMMARY OF THE INVENTION

However, the inventors have found out that the technique of decreasing the number of external terminals in the semiconductor integrated circuit device having the plurality of A/D converters has the following problem.

In the case of mounting a plurality of A/D converters, all of the A/D converters become noise sources and all of the A/D converters are objects influenced by the noise.

In the case of considering an A/D converter as the noise source, the A/D converter causes noise in a large pulse shape in the power supply terminals AVCC and AVSS and the reference terminals REFH and REFL at the time of operation of an internal amplifier as a component of the A/D converter and at the time of operation of an internal D/A (Digital/Analog) converter.

When noise occurs in the power supply terminals and reference terminals at the time of comparison by a comparator after completion of sampling, a conversion error is caused.

For example, in the case of mounting two A/D converters, noise in the operation of one of the A/D converters becomes a conversion error in the other A/D converter. There is the possibility that high-precision A/D conversion cannot be performed.

An object of the present invention is to provide a technique capable of performing A/D conversion at high precision while largely reducing the number of external terminals used for an A/D converter.

The above and other objects and novel features of the present invention will become apparent from the description of the specification and appended drawings.

Outline of a representative one of inventions disclosed in the application will be briefly described as follows.

The present invention relates to a semiconductor integrated circuit device having an A/D converter of a successive approximation type that performs sampling of an input signal and successive approximation to convert an analog signal to a digital signal. The A/D converter includes: a first switch whose one of coupling parts is coupled to an input part to which an analog signal for A/D conversion is inputted; a signal capacitance element whose one of coupling parts is coupled to the other coupling part of the first switch; a D/A converter that outputs an analog signal for conversion; a second switch coupled between an output part of the D/A converter and a coupling part between the first switch and the signal capacitance element; a differential amplifier having a first input part to which the other coupling part of the signal capacitance element is coupled and a second input part to which one of coupling parts of a capacitance element is coupled, and amplifying a differential voltage; and an impedance matching circuit that supplies a reference voltage for comparison to which a predetermined impedance is added to the second input part of the differential amplifier via the capacitance element.

In the present invention, the impedance matching circuit includes: a first impedance unit having an impedance at which a node of the second input part in the differential amplifier becomes optimum at the time of sampling; and a second impedance unit having an impedance at which the node of the second input part in the differential amplifier becomes optimum at the time of successive approximation. At the time of sampling, a reference voltage for comparison is supplied via the first impedance unit. At the time of successive approximation, the reference voltage for comparison is supplied via the second impedance unit.

Further, in the present invention, the first impedance unit includes: a first resistor having an impedance at which the node of the second input part in the differential amplifier becomes optimum at the time of sampling; and a third switch that supplies a reference voltage for comparison to which the impedance of the first resistor is added to the second input part via the capacitance element at the time of sampling. The second impedance unit includes: a second resistor having an impedance at which the node of the second input part in the differential amplifier becomes optimum at the time of successive approximation; and a fourth switch that supplies a reference voltage for comparison to which the impedance of the second resistor is added to the second input part via the capacitance element at the time of successive approximation.

In the present invention, the first resistors and the third switches each of the same number as that of a plurality of sensors for outputting an analog signal, which are externally coupled to the A/D converter are provided, a controller that controls the plurality of third switches is provided, each of the plurality of first resistors has an impedance which becomes optimum for each of the sensors at the time of sampling, and the controller detects one sensor selected from the plurality of sensors and makes a corresponding one of the third switches operate so as to select the first resistor having the impedance optimum to the selected sensor.

The semiconductor integrated circuit device according to the invention may further include: one external supply voltage terminal to which the supply voltage for A/D conversion is supplied; and one external reference voltage terminal to which the reference voltage for A/D conversion is supplied. Two or more A/D converters are provided, and the two or more A/D converters are commonly coupled to the external supply voltage terminal and the external reference voltage terminal so that power is supplied to the A/D converters.

Further, outline of another invention in the application will be briefly described.

The present invention relates to a semiconductor integrated circuit device having an A/D converter of a successive approximation type that performs sampling of an input signal and successive approximation to convert an analog signal to a digital signal. The A/D converter includes: a first switch whose one of coupling parts is coupled to an input part to which an analog signal for A/D conversion is inputted; a D/A converter of a charge re-distribution type that samples and holds the input analog signal for A/D conversion and outputs an analog signal for conversion; a differential amplifier having a first input part to which an output part of the D/A converter of a charge re-distribution type is coupled and a second input part to which one of coupling parts of a capacitance element is coupled, and amplifying a differential voltage; and an impedance matching circuit that supplies a reference voltage for comparison to which a predetermined impedance is added to the second input part of the differential amplifier via the capacitance element.

In the present invention, the impedance matching circuit includes: a first impedance unit having an impedance at which a node of the second input part in the differential amplifier becomes optimum at the time of sampling; and a second impedance unit having an impedance at which the node of the second input part in the differential amplifier becomes optimum at the time of successive approximation. At the time of sampling, a reference voltage for comparison is supplied via the first impedance unit, and at the time of successive approximation, the reference voltage for comparison is supplied via the second impedance unit.

In the present invention, the first impedance unit includes: a first resistor having an impedance at which the node of the second input part in the differential amplifier becomes optimum at the time of sampling; and a third switch that supplies a reference voltage for comparison to which the impedance of the first resistor is added to the second input part via the capacitance element at the time of sampling. The second impedance unit includes: a second resistor having an impedance at which the node of the second input part in the differential amplifier becomes optimum at the time of successive approximation; and a fourth switch that supplies a reference voltage for comparison to which the impedance of the second resistor is added to the second input part via the capacitance element at the time of successive approximation.

In the present invention, the first resistors and the third switches each of the same number as that of a plurality of sensors for outputting an analog signal, which are externally coupled to the A/D converter are provided, a controller that controls the plurality of third switches is provided, each of the plurality of first resistors has an impedance which becomes optimum for each of the sensors at the time of sampling, and the controller detects one sensor selected from the plurality of sensors and makes a corresponding one of the third switches operate so as to select the first resistor having the impedance optimum to the selected sensor.

In the present invention, the semiconductor integrated circuit device may further include: one external supply voltage terminal to which the supply voltage for A/D conversion is supplied; and one external reference voltage terminal to which the reference voltage for A/D conversion is supplied. Two or more A/D converters are provided, and the two or more A/D converters are commonly coupled to the external reference supply voltage terminal and the external reference voltage terminal so that power is supplied to the A/D converters.

Effects obtained by the represented ones of the inventions disclosed in the application will be briefly described as follows.

(1) Since the impedance optimum for sampling and the impedance optimum for the successive approximation can be set, the noise cancelling effect can be obtained maximally, and the influence of noise and the like can be largely reduced.

(2) By the effect (1), a conversion error in the A/D converter can be largely reduced, and high conversion precision can be realized.

DETAILED DESCRIPTION OF THE PREFERRED EMBODIMENTS

Figure 1:
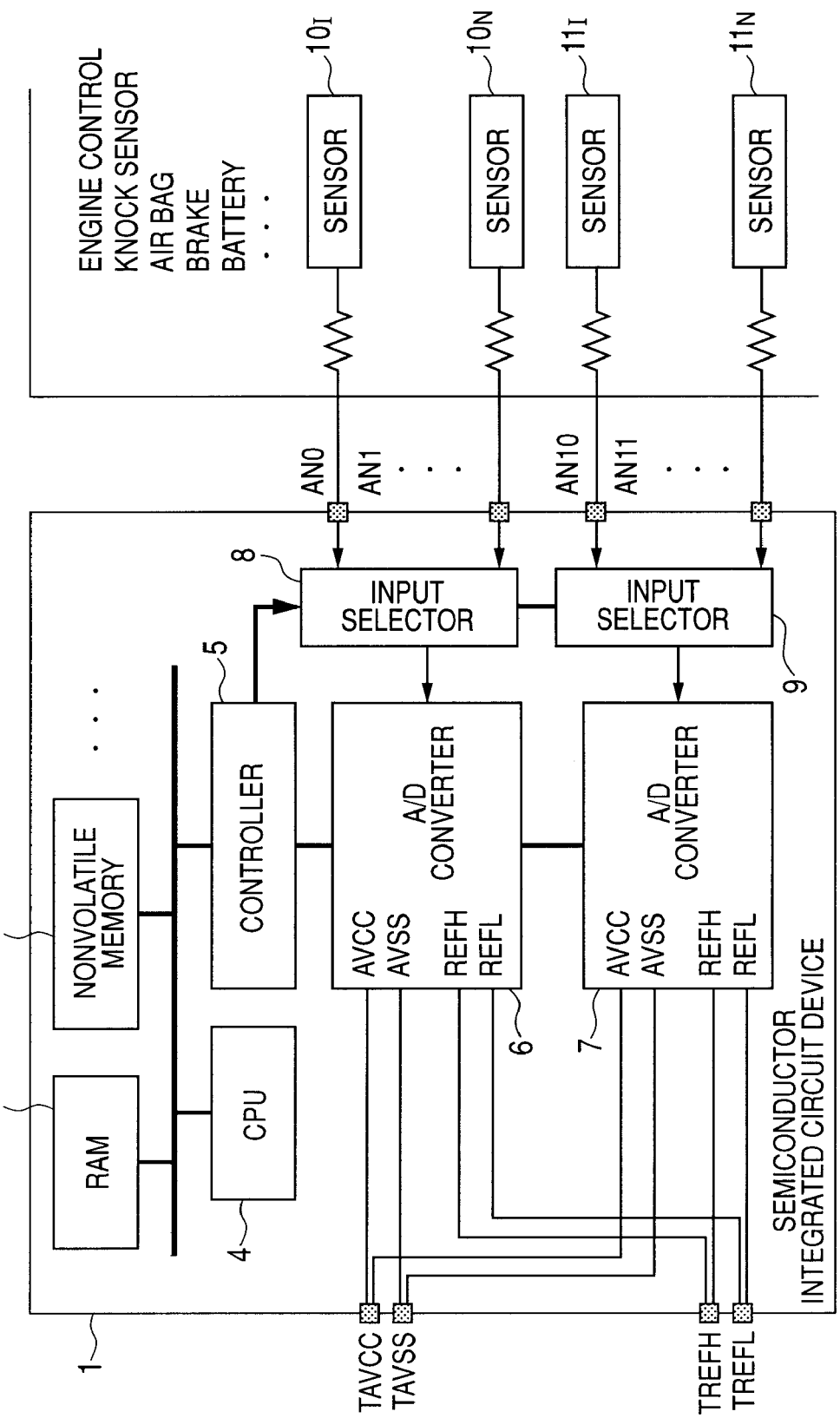
FIG. 1 is a block diagram showing an example of a semiconductor integrated circuit device according to a first embodiment of the invention.

Embodiments of the invention will be described in detail below with reference to the drawings. In all of the drawings for explaining the embodiments, as a rule, the same reference numerals are designated to the same members, and their repetitive explanation will not be repeated.

First Embodiment

Figure 2:
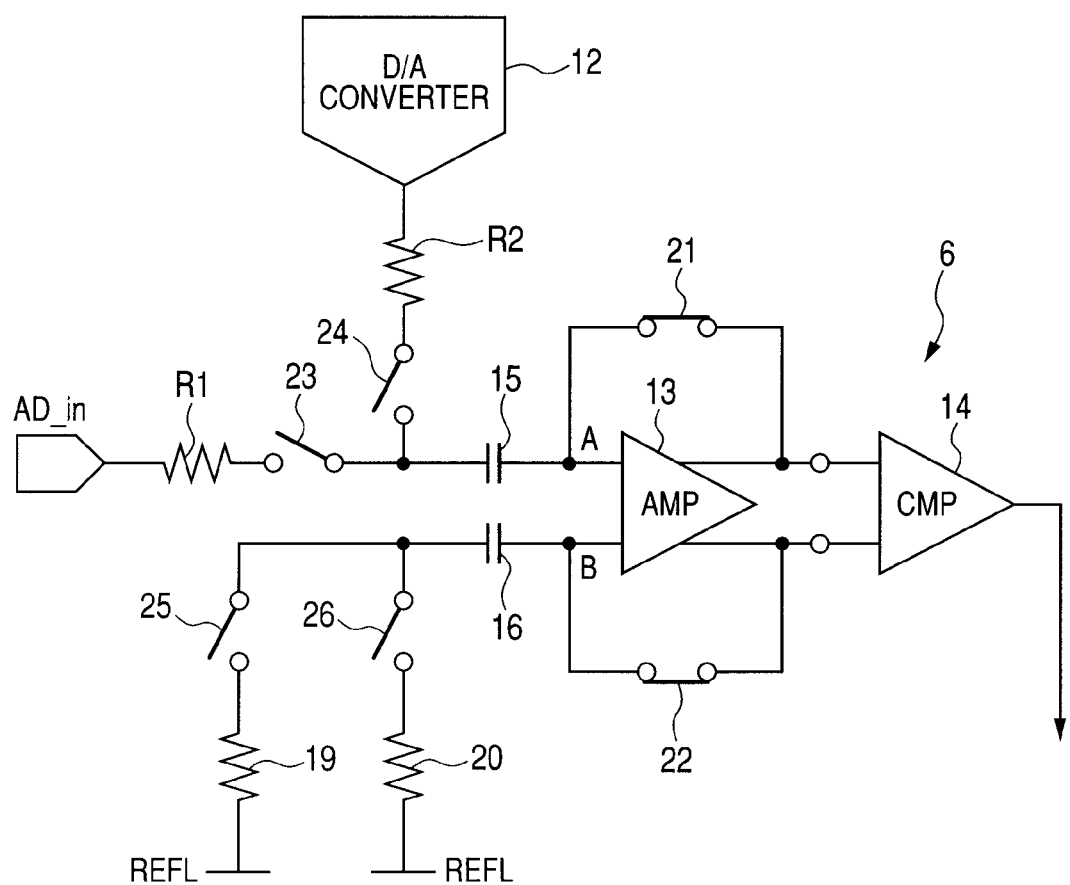
FIG. 2 is an explanatory diagram showing an example of an A/D converter provided for the semiconductor integrated circuit device of FIG. 1.
Figure 3:
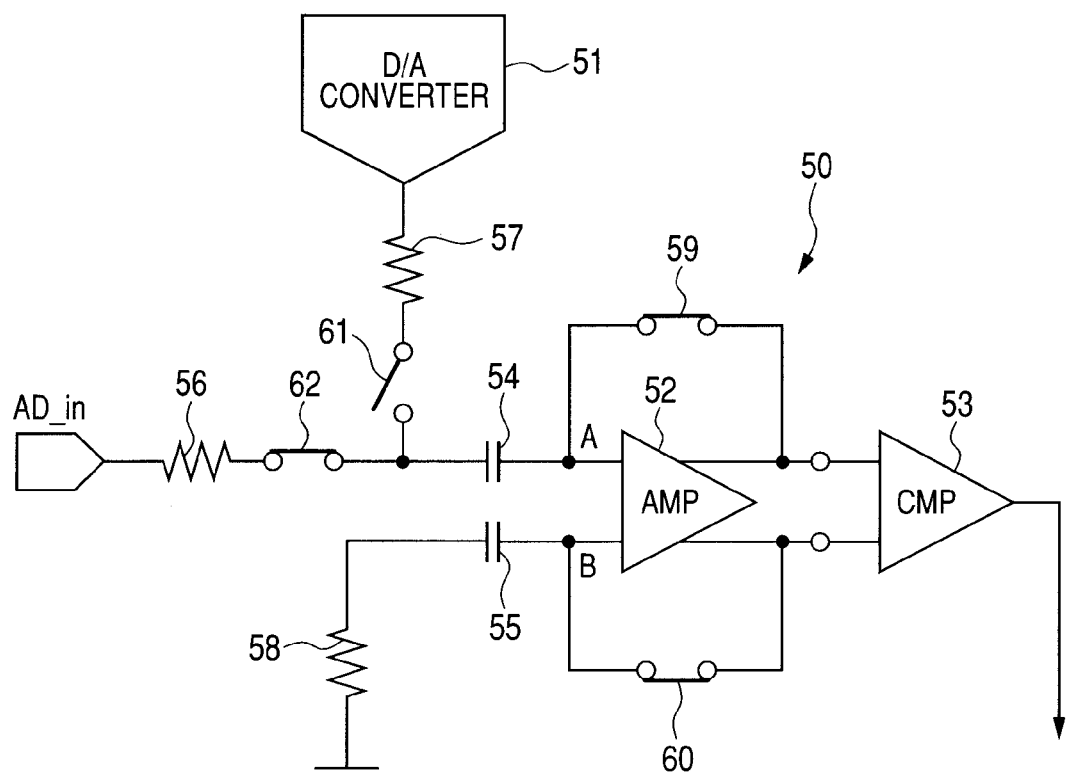
FIG. 3 is an explanatory diagram showing an example of a prior art A/D converter examined by the inventors of the present invention.
Figure 4:
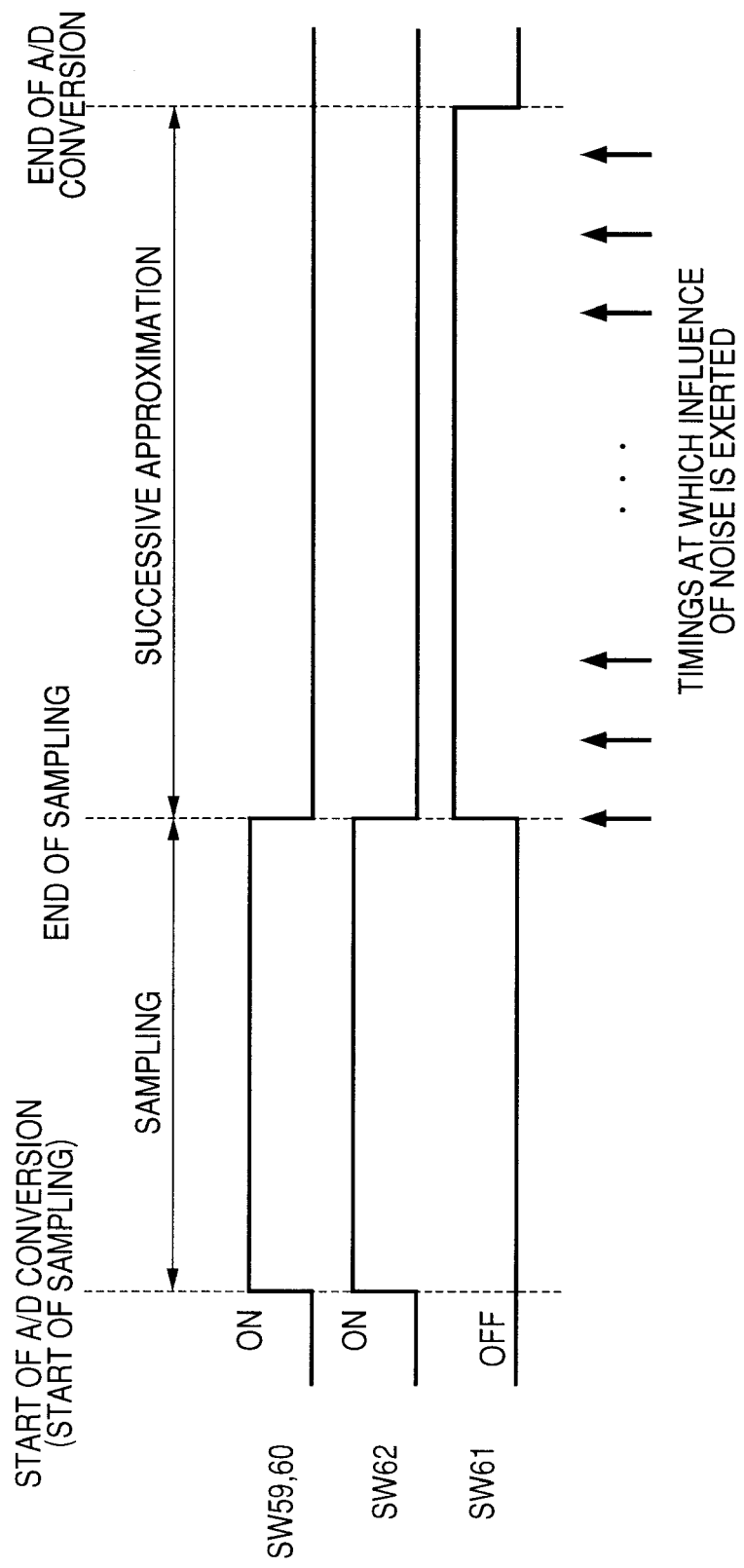
FIG. 4 is a timing chart showing an example of operation in the A/D converter of FIG. 3.
Figure 5:
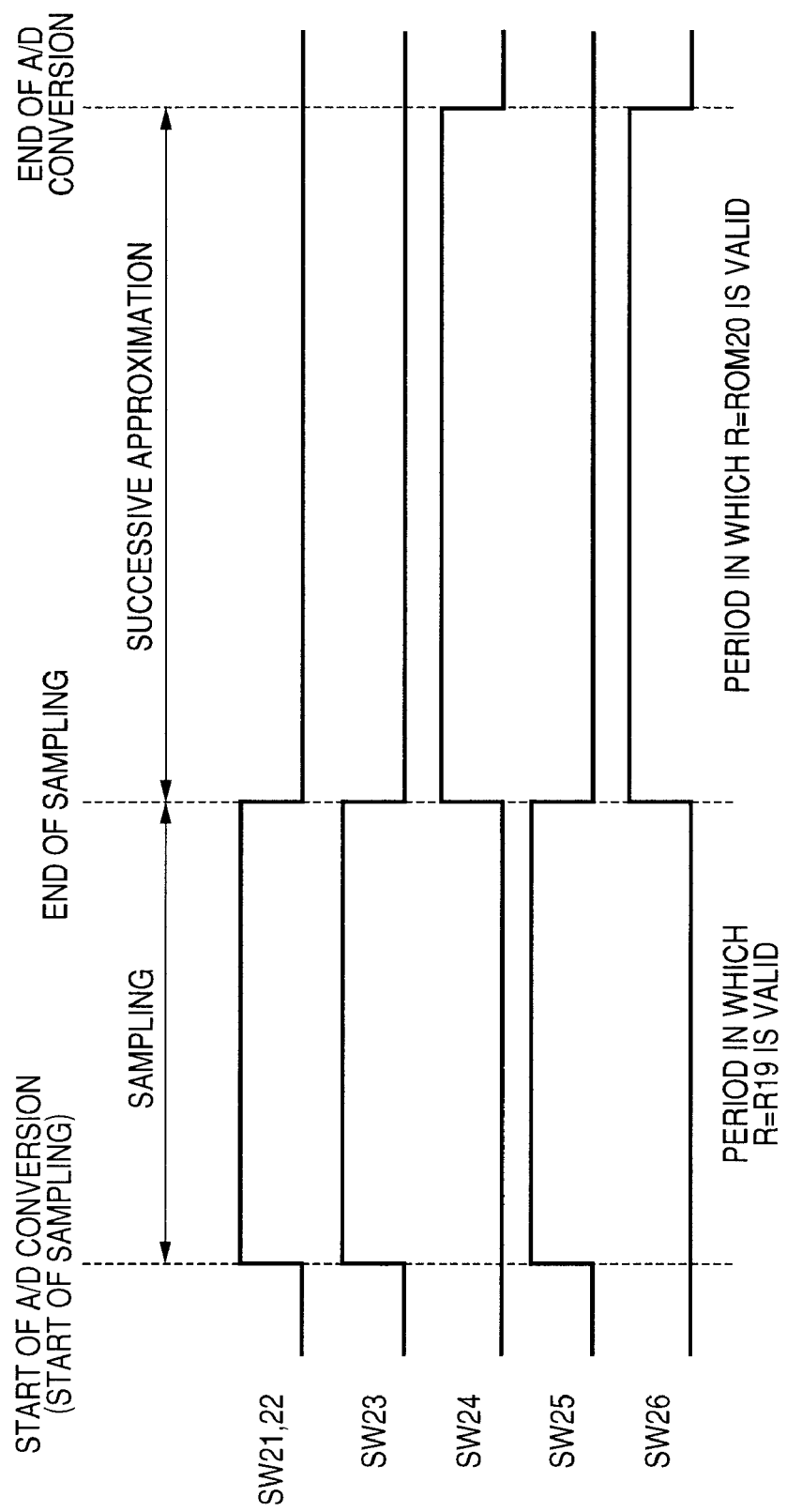
FIG. 5 is a timing chart showing an example of operation in the A/D converter of FIG. 2.

FIG. 1 is a block diagram showing an example of a semiconductor integrated circuit device according to a first embodiment of the invention. FIG. 2 is an explanatory diagram showing an example of an A/D converter provided for the semiconductor integrated circuit device of FIG. 1. FIG. 3 is an explanatory diagram showing an example of a prior art A/D converter examined by the inventors of the present invention. FIG. 4 is a timing chart showing an example of operation in the A/D converter of FIG. 3. FIG. 5 is a timing chart showing an example of operation in the A/D converter of FIG. 2.

In the first embodiment, a semiconductor integrated circuit device 1 is mounted on, for example, a vehicle and performs controls on various systems such as engine control, air-bag control, and air-conditioner control. The semiconductor integrated circuit device 1 has, as shown in FIG. 1, a RAM 2, a nonvolatile memory 3, a CPU 4, a controller 5, A/D converters 6 and 7, and input selectors 8 and 9.

The RAM 2 is a volatile semiconductor memory or the like and is used for temporarily storing data. The nonvolatile memory 3 is a memory exemplified by a flash memory or the like and stores, for example, an operation program or the like in the semiconductor integrated circuit device 1.

The CPU 4 performs all of controls in the semiconductor integrated circuit device 1. The controller 5 controls the input selectors 8 and 9 and the like on the basis of control of the CPU 4. A plurality of sensors $10_1$ to $10_N$ are coupled to the A/D converter 6, and a plurality of sensors $11_1$ to $11_N$ are coupled to the A/D converter 7.

The A/D converter 6 converts analog signals output from the sensors $10_1$ to $10_N$ to digital signals, and the A/D converter 7 converts analog signals output from the sensors $11_1$ to $11_N$ to digital signals.

The sensors $10_1$ to $10_N$ and $11_1$ to $11_N$ are various sensors for engine control, such as a knock sensor, air-bag control, brake control, and battery control.

Based on a control signal output from the controller 5, the input selector 8 switches so that an analog signal output from a selected sensor out of the sensors $10_1$ to $10_N$ is input to the A/D converter 6.

Based on a control signal output from the controller 5, the input selector 9 switches so that an analog signal output from a selected sensor out of the sensors $11_1$ to $11_N$ is input to the A/D converter 6.

The semiconductor integrated circuit device 1 is also provided with power supply terminals TAVCC, TAVSS, TREFH, and TREFL as external terminals. The power supply terminal TAVCC as an external supply voltage terminal is a terminal for supplying supply voltage AVCC as the operation voltage of the A/D converters 6 and 7, and the power supply terminal TAVSS as an external reference voltage terminal is a terminal for supplying reference voltage AVSS of the A/D converters 6 and 7.

The power supply terminal TREFH is a terminal for supplying a high-side reference voltage REFH, and the power supply terminal TREFL is a terminal for supplying a low-side reference voltage REFL as a reference voltage for comparison to the A/D converters 6 and 7.

FIG. 2 is an explanatory diagram showing an example of the A/D converter 6 provided for the semiconductor integrated circuit device 1 in FIG. 1. Although FIG. 2 shows the A/D converter 6, the A/D converter 7 also has a configuration similar to that of the A/D converter 6.

As shown in the diagram, the A/D converter 6 includes a D/A converter 12, an amplifier 13, a comparator 14, capacitance elements 15 and 16, resistors 19 and 20, and switches 21 to 26.

An impedance matching circuit is constructed by the resistor 19 as a first resistor, the resistor 20 as a second resistor, the switch 25 as a third switch, and the switch 26 as a fourth switch, a first impedance unit is constructed by the resistor 19 and the switch 25, and a second impedance unit is constructed by the resistor 20 and the switch 26.

A resistor R1 in the diagram represents an impedance of a sensor (any of the sensors $10_1$ to $10_N$) coupled to the A/D converter 6 and an impedance of the input selector 8, and a resistor R2 indicates an output impedance of the D/A converter 12.

One of coupling parts of the switch 24 as a second switch is coupled to the output part of the D/A converter 12 that outputs a converter analog signal. In one embodiment, the converter analog signal may be a voltage for conversion as an analog signal for conversion, and the impedance of the resistor R2 is provided between the output part of the D/A converter 12 and one of the coupling parts of the switch 24.

One of coupling parts of the switch 23 as the first switch is coupled to an input part AD_in of the A/D converter 6, and the impedance of the resistor R1 is provided between the input part AD_in and one of the coupling parts of the switch 23. To the other coupling part of the switch 23, the other coupling part of the switch 24 and one of the coupling parts of the sampling capacitance element 15 are coupled.

To the other coupling part of the sampling capacitance element 15, a first input part of the amplifier 13 as a differential amplifier and one of coupling parts of the switch 21 are coupled. To a first output part of the amplifier 13, the other coupling part of the switch 21 and a first input part of the comparator 14 are coupled.

To one of coupling parts of the resistor 19 and one of coupling parts of the resistor 20, the low-side reference voltage REFL is coupled. One of coupling parts of the switch 25 is coupled to the other coupling part of the resistor 19, and one of coupling parts of the switch 26 is coupled to the other coupling part of the resistor 20.

To the other coupling part of each of the switches 25 and 26, one of coupling parts of the reference capacitance element 16 is coupled. To the other coupling part of the reference capacitance element 16, the second input part of the amplifier 13 and one of the coupling parts of the switch 22 are coupled.

In this second embodiment seen in FIG. 2, switch 25 and resistor 19 are in electrical series with one another and form a first impedance unit, while switch 26 and resistor 20 are in electrical series with one another and form a second impedance unit. The first impedance unit and the second impedance unit are in electrical parallel with one another, both being connected between the reference capacitance element 16 and the low-side reference voltage REFL.

To the second output part of the amplifier 13, the other coupling part of the switch 22 and the second input part of the comparator 14 are coupled. A result of successive approximation is obtained from the output part of the comparator 14, and a digital signal converted finally is output as a conversion result of the A/D converter 6.

A prior art A/D converter 50 examined by the inventors of the present invention will be described with reference to FIG. 3.

As described in the diagram, the A/D converter 50 includes a D/A converter 51, an amplifier 52, a comparator 53, capacitance elements 54 and 55, resistors 56 to 58, and switches 59 to 62.

The resistor 56 in the diagram expresses a total value of the impedances of coupled sensors and the impedances of input selectors, and the resistor 57 indicates an output impedance of the D/A converter 51.

One of coupling parts of the switch 61 is coupled to the output part of the D/A converter 51. One of coupling parts of the switch 62 is coupled to the input part AD_in of the A/D converter 50. The other coupling part of the switch 61 and one of coupling parts of the capacitance element 54 are coupled to the other coupling part of the switch 62. A first input part of the amplifier 52 as a differential amplifier and one of coupling parts of the switch 59 are coupled to the other coupling part of the capacitance element 54.

The other coupling part of the switch 59 and a first input part of the comparator 53 are coupled to a first output part of the amplifier 52. A reference voltage VSS is coupled to one of coupling parts of the resistor 58.

One of coupling parts of the capacitance element 55 is coupled to the other coupling part of the resistor 58, and one of coupling parts of the switch 60 and the second input part of the amplifier 52 are coupled to the other coupling part of the capacitance element 55.

To the second output part of the amplifier 52, the other coupling part of the switch 60 and the second input part of the comparator 53 are coupled. To the amplifier 52 and the comparator 53, the power supply voltage AVCC and the reference voltage AVSS are supplied as the operation voltages. A result of successive approximation is obtained from the output part of the comparator 53.

Next, the operation of the A/D converter 50 will be described by using the timing chart of FIG. 4. In FIG. 4, the operation timings of the switches 59 and 60 and the switches 62 and 61 are shown from the top to bottom.

First, when sampling starts in the A/D converter 50, the switches 59, 60 and 62 are turned on (conduction state) and the switch 61 is turned off (nonconductive state).

The signal capacitance element 54, which serves as a sampling capacitor, is charged with charges corresponding to the difference voltage between the voltage which is input from the input part AD_in and the voltage at the first node A (FIG. 3). The reference capacitance element 55 on the other side is similarly charged with charges corresponding to the difference voltage between the second node B (FIG. 3) and the reference voltage VSS.

At the end of the sampling, the switches 59, 60, and 62 are turned off, and charges corresponding to the difference voltage between the voltage which is input from the input part AD_in and the voltage at the first node A are stored in the capacitance element 54.

Noise occurs at the moment of shift from the sampling to the holding. When convergence of the noise varies between the first and second nodes A and B, the noise is also sampled as a differential component and causes a conversion error.

To minimize the influence of the noise, the impedance viewed from the first node A of the amplifier 52 to the input and the impedance viewed from the second node B to the input have to be matched.

Subsequently, at the time of successive approximation, the path from the input part AD_in is disconnected by the switch 62. When the switch 61 is turned on, the D/A converter 51 is coupled. A converter analog signal is output from the D/A converter 51. In one embodiment, a voltage for comparison is sequentially output from the D/A converter 51 to the amplifier 52 and compared by the comparator 53.

Similarly also at the time of successive approximation, the impedance viewed from the first node A and that viewed from the second node B have to be matched.

At the time of sampling, the optimum resistance value of the resistor 58 is an impedance of resistor 58=resistor 56+switch 62. The resistor 58 has a total value of the impedance of the coupled sensor and the impedance of the input selector, which is a relatively large value.

On the other hand, at the time of successive approximation, the optimum resistance value of the resistor 58 is an impedance of resistor 58=resistor 57+switch 61. The resistor 57 has an output impedance of the D/A converter 51. For higher speed of A/D conversion, the resistance value of the resistor 57 is preferably a small value.

As described above, the optimum impedance value for sampling and the optimum impedance value for comparison are largely different from each other. Therefore, in the case of fixing the resistor 58 at the impedance optimum for sampling, a conversion error occurs due to insufficient speed. On the other hand, in the case of fixing the resistor 58 at the impedance optimum for comparison, a conversion error caused by the difference in conversion waveforms of noise occurs due to the difference in impedance at the time of the sampling.

Next, the action in the A/D converter 6 according to the embodiment will be described.

First, in the A/D converter 6 shown in FIG. 2, the resistor 19 has a resistance value optimum for the sampling, and the resistor 20 is set to a resistance value optimum for the successive approximation.

In the case where the impedances of the switches 23 and 25 are equal to each other, the resistance value of the resistor 19 as the optimum value is a value obtained by subtracting the impedance of the switch 23 from the impedance (resistor R1) of a path extending from the input part AD_in to the left end of the signal capacitance element 15.

In the case where the impedances of the switches 24 and 26 are equal to each other, the resistance value of the resistor 20 is equal to the impedance of a path including the output resistance (resistor R2) on the D/A converter 12 side and extending from the D/A converter 12 excluding the impedance of the switch 24 to the left end of the signal capacitance element 15.

FIG. 5 is a timing chart showing an example of the operation in the A/D converter 6. In FIG. 5, from top to bottom, operation timings of the switches 21 and 22, the switch 23, the switch 24, the switch 25, and the switch 26 are shown.

First, at the time of sampling, the switches 21 and 22, the switch 23, and the switch 25 are turned on, and the switches 24 and 26 are turned off.

At this time, since the resistor 19 is set to the resistance value optimum for the sampling, when the impedance in the direction from the first node A in FIG. 2 to the left side and the impedance in the direction from the second node B in FIG. 2 to the left side almost match each other, the effect of cancelling noise at the time of sampling is obtained maximally.

Subsequently, at the time of successive approximation, each of the switches 21 and 22, the switch 23, and the switch 25 is turned off, and each of the switch 24 and the switch 26 is turned on. Since the resistor 20 is set to the resistance value optimum for the successive approximation as described above, the impedance in the direction from the first node A in FIG. 2 to the left side and the impedance in the direction from the second node B in FIG. 2 to the left side almost match, and the effect of cancelling noise at the time of successive approximation is obtained maximally.

In such a manner, by switching the switches 25 and 26 so that the impedance (the resistance value of the resistor 19) optimum for the sampling is set at the time of sampling, and the impedance (the resistance value of the resistor 20) optimum for the successive approximation is set at the time of successive approximation, the influence of external noise and power supply noise exerted on the first node A and that exerted on the second node B are made the same, the noise cancelling effect can be obtained maximally, and a conversion error in the A/D converter 6 can be reduced.

Second Embodiment

Figure 6:
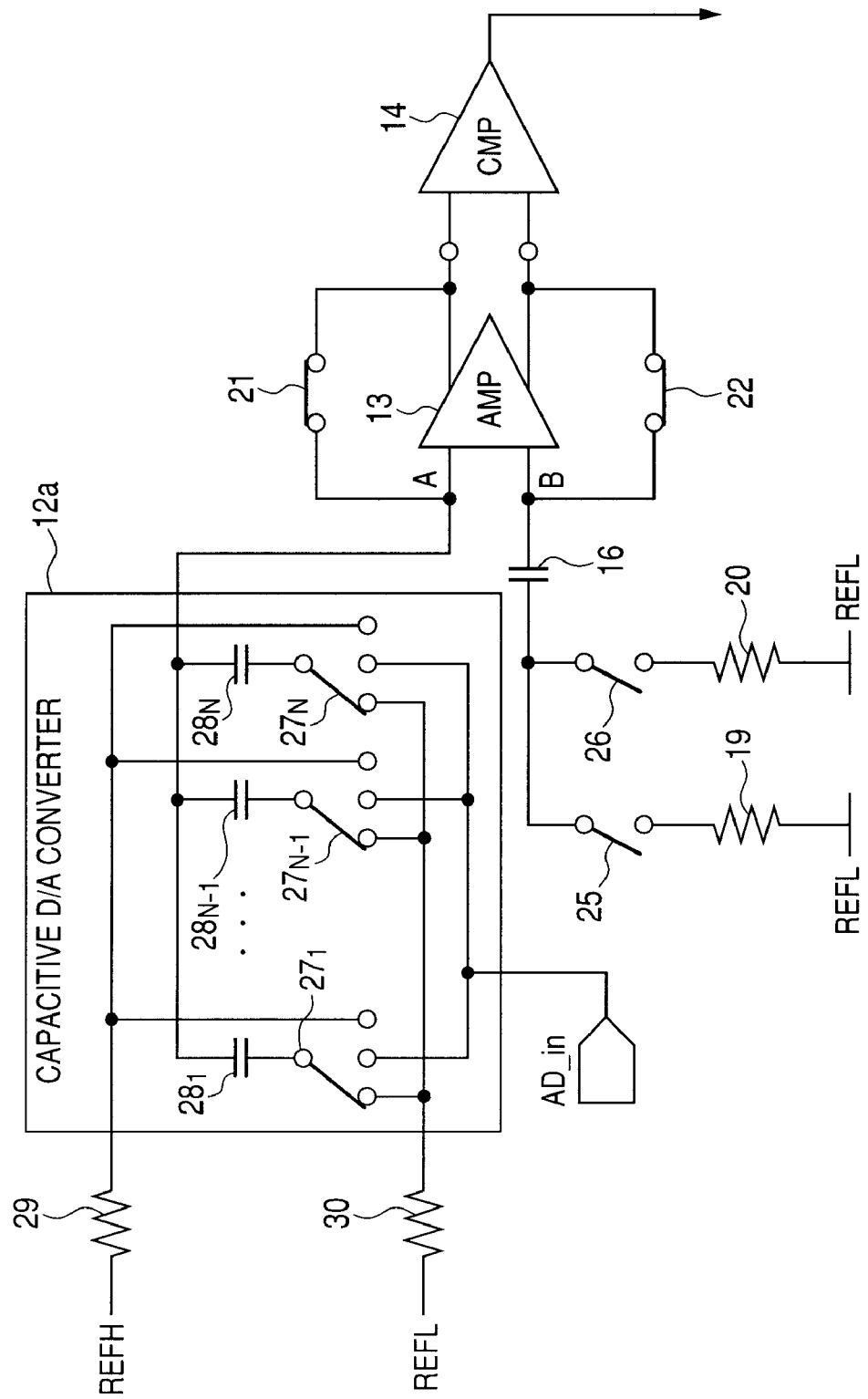
FIG. 6 is an explanatory diagram showing an example in an A/D converter according to a second embodiment of the invention.
Figure 7:
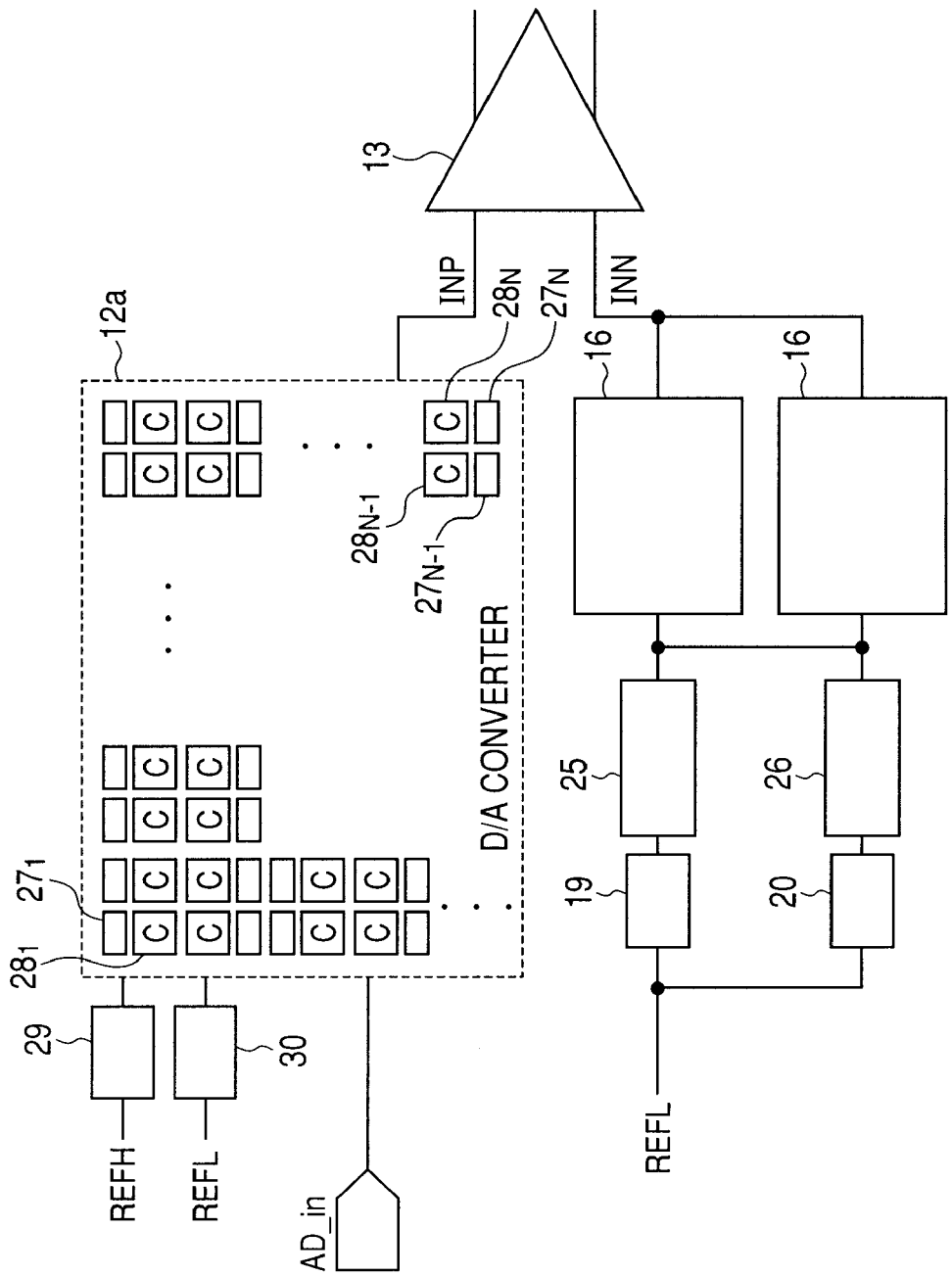
FIG. 7 is an explanatory diagram showing an example of layout of a part of the A/D converter of FIG. 6.

FIG. 6 is an explanatory diagram showing an example of an A/D converter in a second embodiment of the invention, and FIG. 7 is an explanatory diagram showing an example of layout in a part of the A/D converter of FIG. 6.

The second embodiment relates to the case of mounting a capacitive D/A converter 12a of a charge re-distribution type on the A/D converter 6 (7) in the first embodiment, and the capacitance of a sampling capacitive D/A converter is commonly used.

As shown in FIG. 6, the A/D converter 6 has the capacitive D/A converter 12a, the amplifier 13, the comparator 14, the reference capacitance element 16, the resistors 19 and 20, resistors 29 and 30, and the switches 21, 22, 25, and 26. Although the A/D converter 6 is shown in FIG. 6, the A/D converter 7 also has a configuration similar to that of the A/D converter 6.

Since the connection configuration of the amplifier 13, the comparator 14, the reference capacitance element 16, the resistors 19 and 20, and the switches 21, 22, 25, and 26 is similar to that of FIG. 2 of the first embodiment, its description will not be repeated.

The capacitive D/A converter 12a includes a plurality of switches $27_1$ to $27_N$ and the corresponding plurality of component signal capacitance elements $28_1$ to $28_N$ which are arranged in electrical parallel and together constitute a signal capacitive element. The high-side reference voltage REFH is supplied to one of coupling parts of the resistor 29, and the low-side reference voltage REFL is supplied to one of coupling parts of the resistor 30.

A first input part of the amplifier 13 is coupled to each of one of coupling parts of the capacitance elements $28_1$ to $28_N$, and coupling parts of the switches $27_1$ to $27_N$ are coupled to the other coupling parts of the component signal capacitance elements $28_1$ to $28_N$, respectively.

For the other coupling part of each of the switches $27_1$ to $27_N$, first to third coupling parts are provided. The other coupling part of the resistor 30 is coupled to the first coupling part of each of the switches $27_1$ to $27_N$.

The input part AD_in is coupled to the second coupling part of each of the switches $27_1$ to $27_N$, and the other coupling part of the resistor 29 is coupled to the third coupling part of each of the switches $27_1$ to $27_N$.

The switches $27_1$ to $27_N$ perform switching so that the other coupling parts of the component signal capacitance elements $28_1$ to $28_N$ are selectively coupled to the resistor 30, the input part AD_in, or the resistor 29.

The operation of the capacitive D/A converter 12a will now be described.

First, at the time of sampling, switching is performed so that all of the switches $27_1$ to $27_N$ are coupled to the input part AD_in to charge the component signal capacitance elements $28_1$ to $28_N$ with input voltage. After completion of charging the component signal capacitance elements $28_1$ to $28_N$ with the input voltage, the switches $27_1$ to $27_N$ are disconnected from the input part AD_in, and the charges are held until comparison completes. As described above, the capacitive D/A converter 12a of the charge re-distribution type has the sampling function and the holding function.

At the time of comparison, the switches $27_1$ to $27_N$ are switched alternately between the high-side reference voltage REFH and the low-side reference voltage REFL, the input voltage is compared with the high-side reference voltage REFH and the low-side reference voltage REFL, and bits are determined in order from the MSB (Most Significant Bit).

For example, in the case where the comparison voltage of the MSB is the half of the full scale, the half of the capacitance of the component signal capacitance elements $28_1$ to $28_N$ is coupled to the input voltage and the high-side reference voltage REFH, and the rest is coupled to the low-side reference voltage REFL.

In this case, the output impedance may be the resistors 29 and 30 as current-limiting resistors inserted in the high-side reference voltage REFH and the low-side reference voltage REFL, an on-state resistance of the switches $27_1$ to $27_N$, interconnection resistance from the power supply terminal TREFH to which the high-side reference voltage REFH is supplied and from the power supply terminal TREFL to which the low-side reference voltage REFL is supplied, and the like.

Therefore, the resistance value optimum for the comparison is a value obtained by adding all of them. In the case where the size of the switch 25 in FIG. 2 and the total size of the switches $27_1$ to $27_N$ in FIG. 6 are equal to each other, the impedance of the switches $27_1$ to $27_N$ does not have to be considered.

Next, the operation in the A/D converter 6 in the second embodiment will be described.

First, at the time of sampling, as described above, the switches $27_1$ to $27_N$ of the capacitive D/A converter 12a are coupled to the input part AD_in, the switches 21 and 22 and the switch 25 are turned on, and the switch 26 is turned off.

By the operation, the input voltage is sampled in the component signal capacitance elements $28_1$ to $28_N$ as signal capacitors. Consequently, the resistor 19 which is set to the resistance value optimum for sampling is coupled, so that the impedance optimum for sampling is obtained.

Subsequently, at the time of comparison, as described above, the switches $27_1$ to $27_N$ of the capacitive D/A converter 12a are coupled to the high-side reference voltage REFH or the low-side reference voltage REFL, each of the switches 21 and 22 and the switch 25 is turned off, and the switch 26 is turned on.

As a result, the resistor 20 is coupled and, at the time of successive approximation, the impedance optimum for the successive approximation is set.

FIG. 7 is an explanatory diagram showing an example of the layout in a part of the A/D converter 6 in FIG. 6.

In FIG. 7, the resistor 29 is disposed in an upper left part, and the resistor 30 is disposed below the resistor 29. On the right side of the resistors 29 and 30, the capacitive D/A converter 12a is disposed.

In the capacitive D/A converter 12a, a row of a plurality of switches 27, a row of a plurality of capacitance elements 28, a row of a plurality of capacitance elements 28, and a row of a plurality of switches 27, which are arranged from left to right, are linearly arranged, and this arrangement pattern is repeated.

The resistor 19 is disposed below the left part of the capacitive D/A converter 12a, and the resistor 20 is disposed below the resistor 19. On the right side of the resistors 19 and 20, the reference capacitance element 16 is disposed. On the right side of the capacitive D/A converter 12a and the reference capacitance element 16, the amplifier 13 is disposed.

Features in the layout are, as shown in the diagram, that the reference capacitance element 16, which serves as a differential-side capacitor, is coupled to the low-side reference voltage REFL via the resistors 19 and 20, and the resistance value is switched by the switches 25 and 26. The reference capacitance element 16 is disposed symmetrical to the capacitive D/A converter 12a when viewed from the amplifier 13.

With the arrangement, also in the second embodiment, in a manner similar to the first embodiment, the switching is performed by the switches 25 and 26 to the resistor 19 which becomes the impedance optimum for sampling at the time of sampling and to the resistor 20 which becomes the impedance optimum for the successive approximation at the time of successive approximation. Thus, the influences of the external noise and the power supply noise exerted on the first and second nodes A and B (FIG. 6) are made the same, the noise cancelling effect can be obtained maximally, and an A/D conversion error can be reduced.

In the second embodiment, the example where the A/D converter 6 (7) is provided with the capacitive D/A converter 12a has been described. For example, the A/D converter 6 may be a resistive D/A converter.

Figure 8:
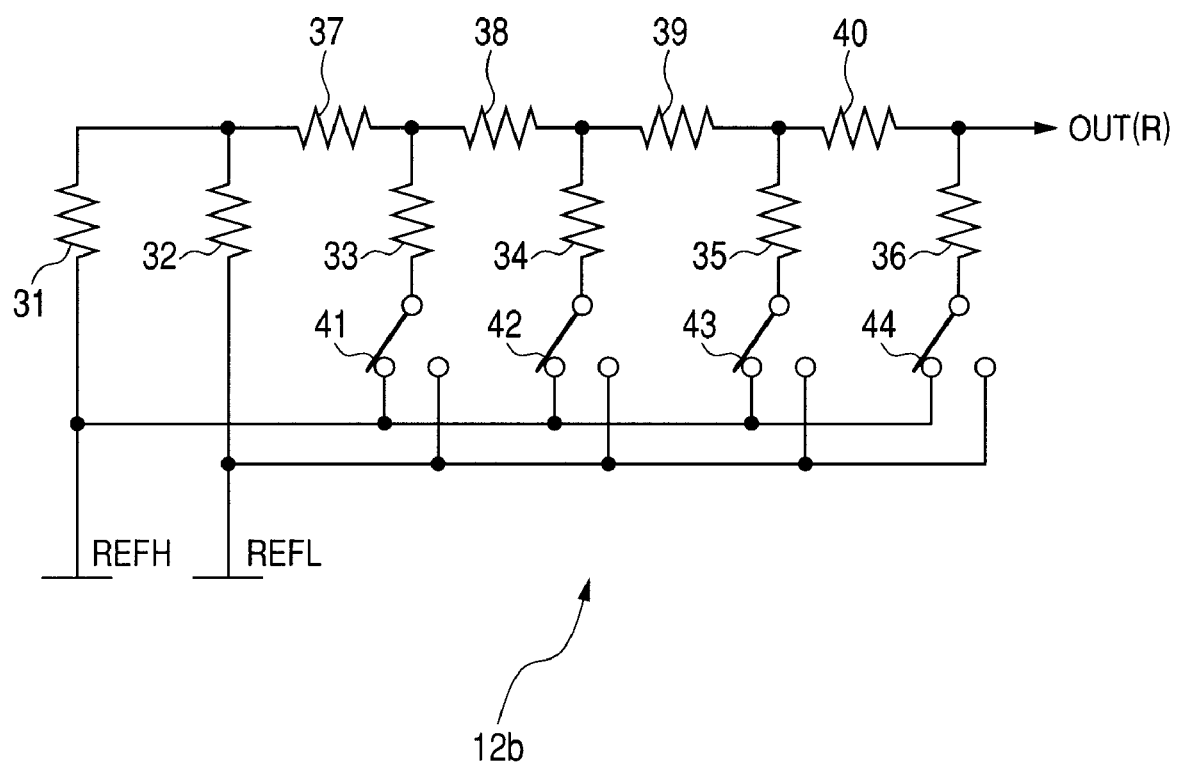
FIG. 8 is an explanatory diagram showing another example in the A/D converter according to the second embodiment of the invention.

In this case, the resistive D/A converter 12b includes, as shown in FIG. 8, resistors 31 to 40 and switches 41 to 44.

One of coupling parts of the resistor 37 is coupled to one of coupling parts of each of the resistors 31 and 32, and one of coupling parts of the resistor 38 and one of coupling parts of the resistor 33 are coupled to the other coupling part of the resistor 37. One of coupling parts of the resistor 39 and one of coupling parts of the resistor 34 are coupled to the other coupling part of the resistor 38, and one of coupling parts of the resistor 40 and one of coupling parts of the resistor 35 are coupled to the other coupling part of the resistor 39.

One of coupling parts of the resistor 36 is coupled to the other coupling part of the resistor 40, and the coupling part serves as the output part of the resistive D/A converter 12b. To the other coupling part of each of the resistors 33 to 36, one of coupling parts of the switches 41 to 44 is coupled.

The other coupling part of each of the switches 41 to 44 has first and second other coupling parts. The high-side reference voltage REFH is coupled to the other coupling part of the resistor 31 and the first other coupling part of each of the switches 41 to 44, and the low-side reference voltage REFL is coupled to the other coupling part of the resistor 32 and the second other coupling part of each of the switches 41 to 44.

In the resistive D/A converter 12b, the relation of resistance values between the resistors 31 to 36 and the resistors 37 to 40 is R:2R. The output resistance value in this case is expressed as R.

Third Embodiment

Figure 9:
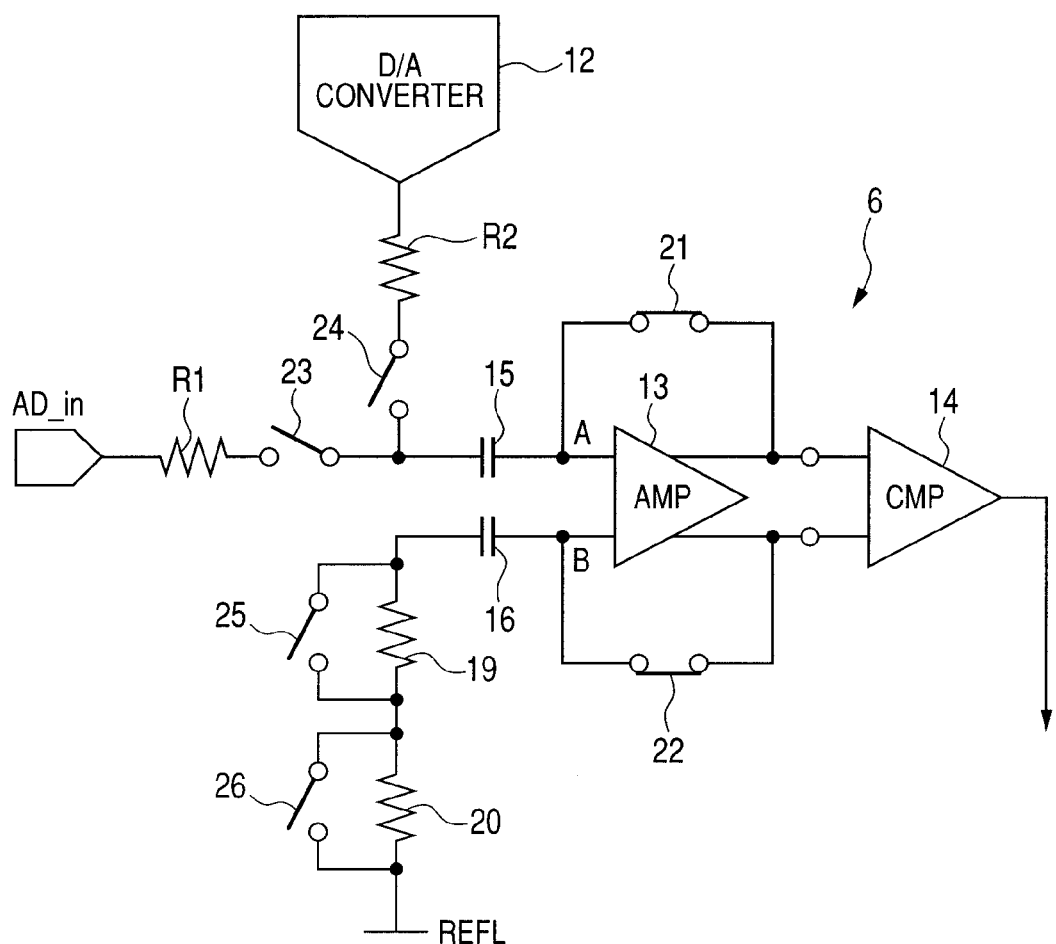
FIG. 9 is an explanatory diagram showing an example of the configuration of an A/D converter according to a third embodiment of the invention.
Figure 10:
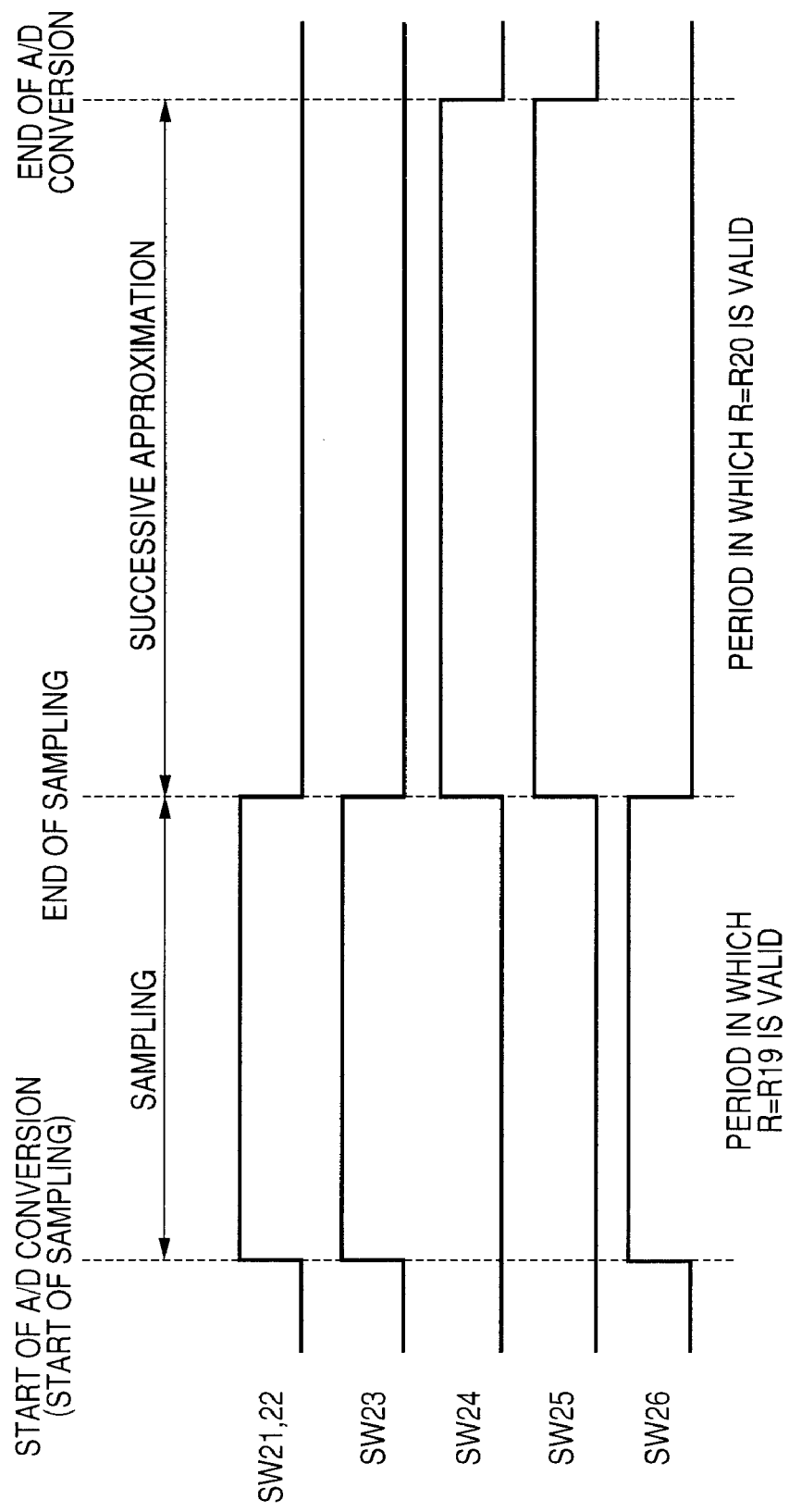
FIG. 10 is a timing chart showing an example of the operation in the A/D converter of FIG. 9.

FIG. 9 is an explanatory diagram showing an example of the configuration of an A/D converter according to a third embodiment of the invention, and FIG. 10 is a timing chart showing an example of the operation in the A/D converter 6 of FIG. 9.

In the third embodiment, as shown in FIG. 9, the A/D converter 6 includes the D/A converter 12, the amplifier 13, the comparator 14, the capacitance elements 15 and 16, the resistors 19 and 20, and the switches 21 to 26.

The configuration is similar to that shown in FIG. 2 of the first embodiment, and the difference is coupling of the switches 25 and 26 and the resistors 19 and 20. In this case, to the one coupling part of the reference capacitance element 16, one of coupling parts of the switch 25 and one of coupling parts of the resistor 19 are coupled.

To the other coupling part of the switch 25 and the other coupling part of the resistor 19, one of coupling parts of the switch 26 and one of coupling parts of the resistor 20 are coupled. To the other coupling part of the switch 26 and the other coupling part of the resistor 20, the low-side reference voltage REFL is coupled.

The resistor 19 has a resistance value optimum for the sampling, and the resistor 20 has a resistance value optimum for the successive approximation.

In this third embodiment seen in FIG. 9, switch 25 and resistor 19 are in electrical parallel with one another and form a first impedance unit, while switch 26 and resistor 20 are in electrical parallel with one another and form a second impedance unit. Furthermore, the first impedance unit and the second impedance unit are in electrical series with one another, being connected between the reference capacitive element 16 and the low-side reference voltage REFL.

FIG. 10 is a timing chart showing an example of the operation in the A/D converter 6 in FIG. 9. In FIG. 10, from top to bottom, operation timings of the switches 21 and 22, the switch 23, the switch 24, the switch 25, and the switch 26 are shown.

First, at the time of sampling, the switches 21, 22, 23, and 26 are turned on, and the switches 24 and 25 are turned off. Since the switch 25 is off and the switch 26 is on, the resistor 19 becomes valid so that the impedance in the direction from the first node A in FIG. 9 to the left and the impedance in the direction from the second node B in FIG. 9 to the left match. Thus, the noise cancelling effect at the time of sampling can be obtained maximally.

Subsequently, at the time of successive approximation, each of the switches 21, 22, 23, and 26 is turned off, and the switches 24 and 25 are turned on.

Since the switch 25 is on and the switch 26 is off at this time, the resistor 20 becomes valid, and the impedance in the direction from the first node A in FIG. 9 to the left side and the impedance in the direction from the second node B in FIG. 9 to the left side can be made almost matched. Thus, the noise cancelling effect at the time of successive approximation can be obtained maximally.

Accordingly, also in the third embodiment, in a manner similar to the first and second embodiments, the noise cancelling effect in the A/D converter 6 can be largely improved. Therefore, an A/D conversion error can be reduced.

Fourth Embodiment

Figure 11:
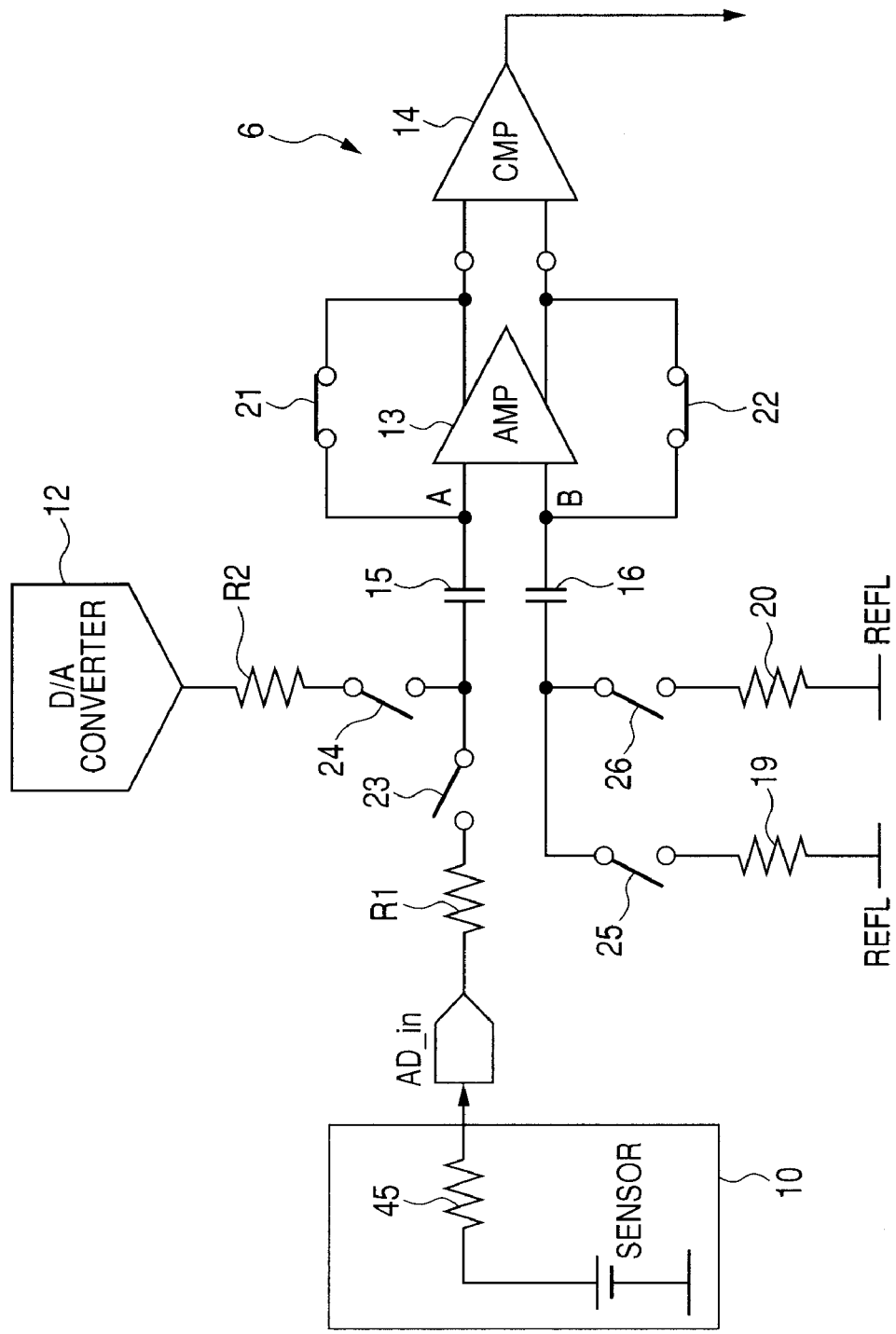
FIG. 11 is an explanatory diagram showing an example of the configuration of an A/D converter according to a fourth embodiment of the invention.

FIG. 11 is an explanatory diagram showing an example of the configuration of an A/D converter according to a fourth embodiment of the invention.

In the fourth embodiment, an example of the case where one sensor is coupled to the A/D converter 6 having a coupling configuration similar to that shown in FIG. 2 of the first embodiment is shown.

In this case, as shown in FIG. 11, in a manner similar to FIG. 2 of the first embodiment, the A/D converter 6 includes the D/A converter 12, the amplifier 13, the comparator 14, the capacitance elements 15 and 16, the resistors 19 and 20, and the switches 21 to 26. The sensor 10 is coupled to the input part AD_in of the A/D converter 6.

The sensor 10 has the impedance of the resistor 45 at the input. The resistance value of the resistor 19 optimum for sampling is obtained by totaling the resistance value of the sensor 10 and the interconnection resistance (resistor R1) when the impedance of the switch 23 and that of the switch 25 are equal to each other. Thus, impedance matching circuit is configured to take into account the impedance of the sensor 10 which provides the input signal to the input, such that the impedance provided at the time of sampling is optimum.

The resistance value of the resistor 20 optimum for the successive approximation is obtained by totaling the output resistance of the D/A converter 12 and the interconnection resistance (resistor R2) when the impedance of the switch 24 and that of the switch 26 are equal to each other.

Consequently, also in the fourth embodiment, in a manner similar to the first and second embodiments, the noise cancelling effect in the A/D converter 6 can be largely improved, so that an A/D conversion error can be reduced.

Fifth Embodiment

Figure 12:
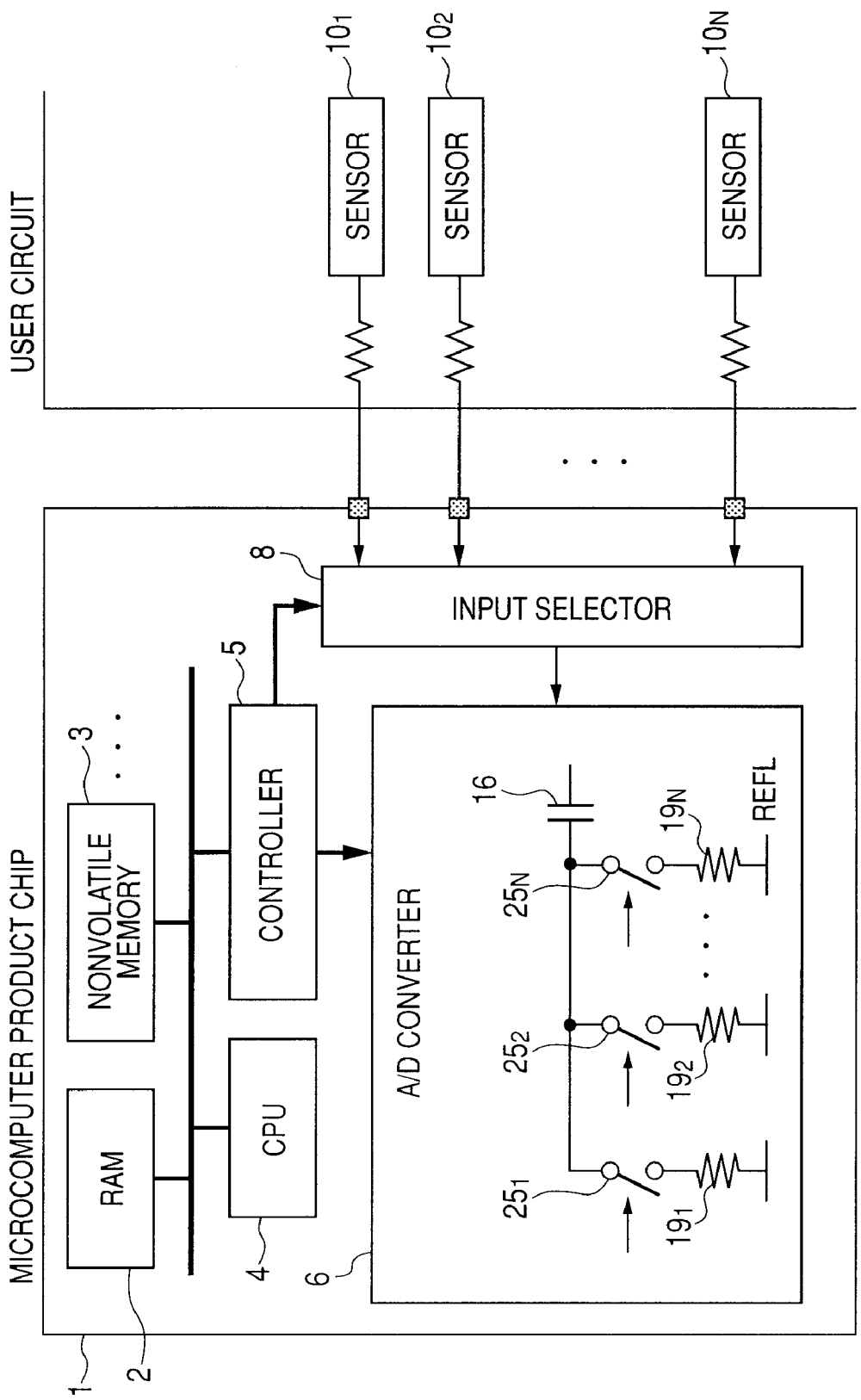
FIG. 12 is a block diagram showing an example of the configuration of a semiconductor integrated circuit device according to a fifth embodiment of the invention.

FIG. 12 is a block diagram showing an example of the configuration of a semiconductor integrated circuit device according to a fifth embodiment of the invention.

In FIG. 2 of the first embodiment, the A/D converter 6 has the resistor 19 having a resistance value optimum for sampling and the resistor 20 having a resistance value optimum for the successive approximation. In the fifth embodiment, the A/D converter is provided with a plurality of resistors corresponding to a plurality of sensors.

In this case, as shown in FIG. 12, the semiconductor integrated circuit device 1 is provided with the RAM 2, the nonvolatile memory 3, the CPU 4, the controller 5, the A/D converter 6, the input selector 8, and the like. The point different from the diagram of the first embodiment is that the A/D converter 7 and the input selector 9 are not provided.

The A/D converter 6 provided in the semiconductor integrated circuit device 1 in FIG. 12 is obtained by providing resistors $19_1$ to $19_N$ and switches $25_1$ to $25_N$ to a configuration similar to that of FIG. 2 of the first embodiment (not shown) having the D/A converter 12, the amplifier 13, the comparator 14, the capacitance elements 15 and 16, the resistor 20, and the switches 21 to 24 and 26.

To one of coupling parts of each of the switches $25_1$ to $25_N$, one of coupling parts of the reference capacitance element 16 is coupled. To the other coupling part of each of the switches $25_1$ to $25_N$, one of coupling parts of each of the resistors $19_1$ to $19_N$ is coupled. To the other coupling part of each of the resistors $19_1$ to $19_N$, the low-side reference voltage REFL is coupled.

The resistor $19_1$ is set to a resistance value optimum for the sensor $10_1$ in sampling. Similarly, the resistors $19_2$ to $19_N$ are set to resistance values optimum for the sensors $10_2$ to $10_N$, respectively, in sampling.

For example, in the case where the resistor $19_1$ is selected by the input selector 8, at the time of sampling, the switch $25_1$ is turned on. At the time of sequential compensation, in a manner similar to the first embodiment, the switch 26 is turned on, and the resistor 20 is coupled.

The operation control on the switches $25_1$ to $25_N$ is performed by, for example, the controller 5. The controller 5 detects, for example, the selected sensor in the sensors $10_1$ to $10_N$ and, on the basis of the detection result, controls the operation on any of the switches $25_1$ to $25_N$ by sending a selection signal to the corresponding switch. Consequently, in the fifth embodiment, at the time of sampling, the resistors $19_1$ to $19_N$ is selectively switched according to the impedance of the sensors $10_1$ to $10_N$, so that the noise cancelling effect can be further improved, and an A/D conversion error can be further decreased.

In the configuration of the A/D converter of FIG. 12, like in FIG. 1, a plurality of A/D converters may be mounted by adding input selectors.

Sixth Embodiment

Figure 13:
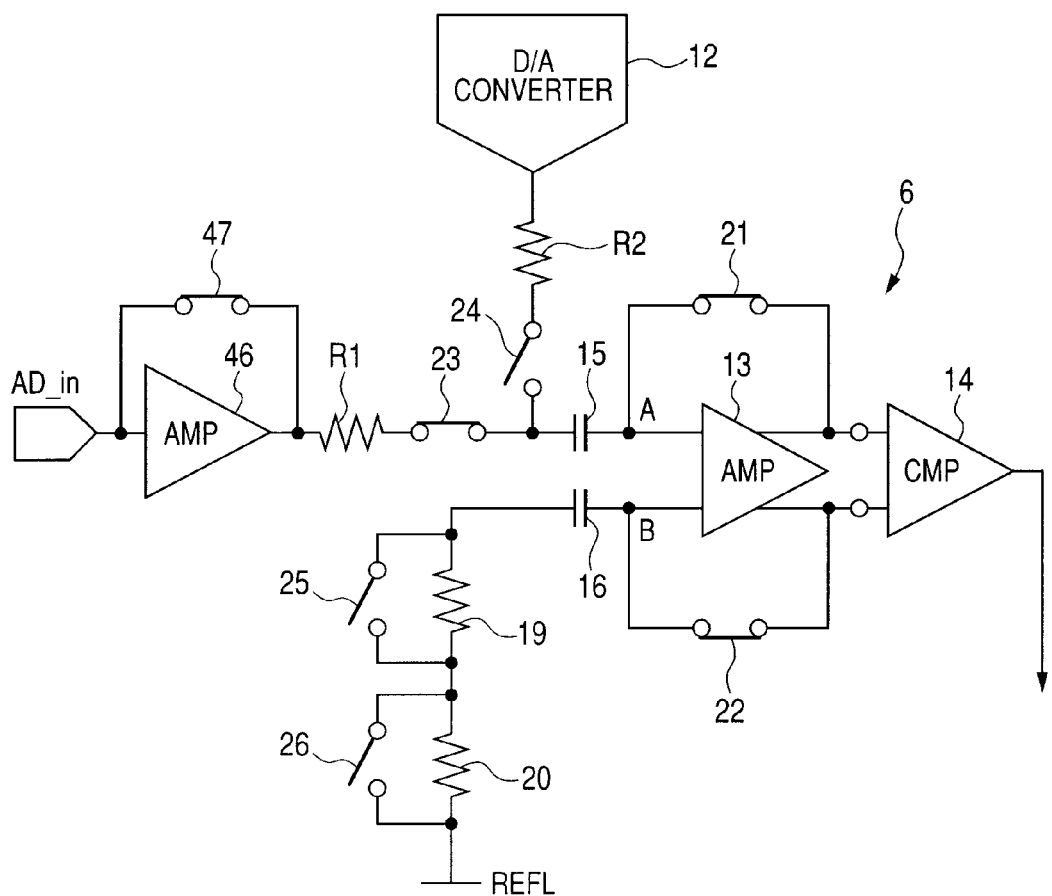
FIG. 13 is an explanatory diagram showing an example of the configuration of an A/D converter according to a sixth embodiment of the invention.
Figure 14:
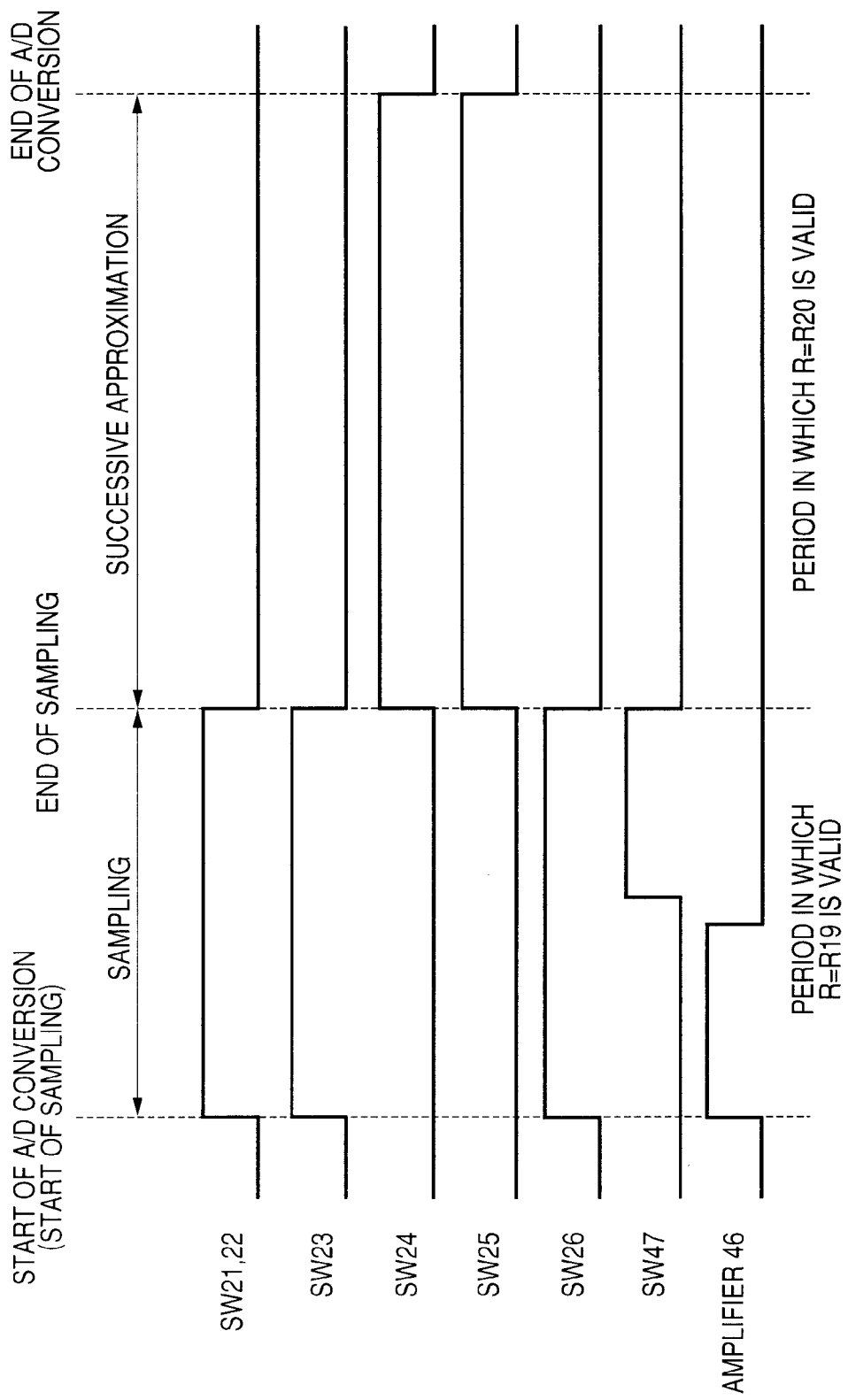
FIG. 14 is a timing chart showing an example of the operation of the A/D converter of FIG. 13.

FIG. 13 is an explanatory diagram showing an example of the configuration of an A/D converter according to a sixth embodiment of the invention. FIG. 14 is a timing chart showing an example of the operation in the A/D converter of FIG. 13.

The sixth embodiment relates to an example that the A/D converter 6 performs sampling with assistance of an amplifier performing a rail-to-rail operation.

As shown in FIG. 13, the A/D converter 6 is obtained by newly adding an amplifier 46 performing the rail-to-rail operation and an amplifier bypass switch 47 connected across the amplifier 46 to the configuration of FIG. 9 of the third embodiment including the D/A converter 12, the amplifier 13, the comparator 14, the capacitance elements 15 and 16, the resistors 19 and 20, and the switches 21 to 26.

The input part AD_in of the A/D converter 6 is coupled to one of the coupling parts of the switch 47 and the input part of the amplifier 46. The one coupling part of the switch 23 is coupled to the other coupling part of the switch 47 and the output part of the amplifier 46.

FIG. 14 is a timing chart showing an example of the operation of the A/D converter 6 of FIG. 13. In FIG. 14, from top to bottom, operation timings of the switches 21, 22, 23, 24, 25, and 26, the switch 47, and the amplifier 46 are shown.

First, in the first half of a sampling period, the amplifier 46 is on (operation), the switches 21, 22, 23, and 26 are on, and the switches 24, 25, and 47 are off. With the assistance of the amplifier 46, the signal capacitance element 15 is charged with the input voltage from the input part AD_in of the A/D converter 6.

In the latter half of the sampling period, to adjust an offset amount of the amplifier 46, the amplifier 46 is off, the switch 47 is on and, in a state where the amplifier 46 does not operate, the signal capacitance element 15 is charged via the switches 47 and 23.

Therefore, the resistance value of the resistor 19 optimum for sampling is obtained by totaling the on-state resistance of the switches 23 and 47 and the interconnection resistance. The resistance value of the resistor 20 optimum for sequential sampling is obtained by totaling the on-state resistance of the switch 24, the output resistance of the D/A converter 12, and the interconnection resistance.

With the configuration, also in the sixth embodiment, the noise cancelling effect can be improved, so that the conversion precision in the A/D converter 6 can be largely improved.

Although the invention achieved by the inventors herein has been concretely described above on the basis of the embodiments, obviously, the invention is not limited to the foregoing embodiments but can be variously modified without departing from the gist.

The present invention is suitable for a high-precision A/D conversion technique in a semiconductor integrated circuit device having a plurality of A/D converters.

What is claimed is:

1. A semiconductor integrated circuit device having an A/D converter of a successive approximation type that performs sampling of an input signal and successive approximation to convert an analog signal to a digital signal, wherein the A/D converter comprises:
a first switch whose one of coupling parts is coupled to an input part to which an analog signal for A/D conversion is inputted;
a signal capacitance element whose one of coupling parts is coupled to the other coupling part of the first switch;
a D/A converter that outputs an analog signal for conversion;
a second switch coupled between an output part of the D/A converter and a coupling part between the first switch and the signal capacitance element;
a differential amplifier having a first input part to which the other coupling part of the signal capacitance element is coupled and a second input part to which one of coupling parts of a reference capacitance element is coupled, and amplifying a differential voltage; and
an impedance matching circuit that supplies a reference voltage for comparison to the second input part of the differential amplifier via the reference capacitance element, the impedance matching circuit configured to selectively provide a first impedance or a second impedance;
wherein the impedance matching circuit comprises:
a first impedance unit providing the first impedance for a time of sampling; and
a second impedance unit providing the second impedance for a time of successive approximation, and
wherein at the time of sampling, a reference voltage for comparison is supplied via the first impedance unit, and at the time of successive approximation, the reference voltage for comparison is supplied via the second impedance unit.

2. The semiconductor integrated circuit device according to claim 1, wherein the first impedance unit comprises:
a first resistor having an impedance for the time of sampling; and
a third switch that supplies a reference voltage for comparison to which the impedance of the first resistor is added to the second input part via the capacitance element at the time of sampling, and
wherein the second impedance unit comprises:
a second resistor having an impedance for the time of successive approximation; and
a fourth switch that supplies a reference voltage for comparison to which the impedance of the second resistor is added to the second input part via the capacitance element at the time of successive approximation.

3. The semiconductor integrated circuit device according to claim 2,
wherein the first resistors and the third switches each of the same number as that of a plurality of sensors for outputting an analog signal, which are externally coupled to the A/D converter are provided,
wherein a controller that controls the plurality of third switches is provided,
wherein each of the plurality of first resistors has an impedance for each of the sensors at the time of sampling, and
wherein the controller detects a sensor selected from the plurality of sensors and makes a corresponding one of the third switches operate so as to select the first resistor having the impedance for the selected sensor.

4. A semiconductor integrated circuit device having:
two or more A/D converters of a successive approximation type that perform sampling of an input signal and successive approximation to convert an analog signal to a digital signal, wherein each A/D converter comprises:
a first switch whose one of coupling parts is coupled to an input part to which an analog signal for A/D conversion is inputted;
a signal capacitance element whose one of coupling parts is coupled to the other coupling part of the first switch;
a D/A converter that outputs an analog signal for conversion;
a second switch coupled between an output part of the D/A converter and a coupling part between the first switch and the signal capacitance element;
a differential amplifier having a first input part to which the other coupling part of the signal capacitance element is coupled and a second input part to which one of coupling parts of a reference capacitance element is coupled, and amplifying a differential voltage; and
an impedance matching circuit that supplies a reference voltage for comparison to the second input part of the differential amplifier via the reference capacitance element, the impedance matching circuit configured to selectively provide a first impedance or a second impedance;
one external power supply voltage terminal to which the power supply voltage for A/D conversion is supplied; and
one external reference potential terminal to which the reference potential for A/D conversion is supplied,
wherein the two or more A/D converters are commonly coupled to the external reference power supply voltage terminal and the external reference potential terminal so that power is supplied to the A/D converters.

5. A semiconductor integrated circuit device having an A/D converter of a successive approximation type that performs sampling of an input signal and successive approximation to convert an analog signal to a digital signal,
wherein the A/D converter comprises:
a first switch whose one of coupling parts is coupled to an input part to which an analog signal for A/D conversion is input;
a D/A converter of a charge re-distribution type that samples and holds the input analog signal for A/D conversion and outputs an analog signal for conversion;
a differential amplifier having a first input part to which an output part of the D/A converter of a charge re-distribution type is coupled and a second input part to which one of coupling parts of a capacitance element is coupled, and amplifying a differential voltage; and
an impedance matching circuit that supplies a reference voltage for comparison to the second input part of the differential amplifier via the capacitance element, the impedance matching circuit configured to selectively provide a first impedance or a second impedance;
wherein the impedance matching circuit comprises:
a first impedance unit providing the first impedance for a time of sampling; and
a second impedance unit providing the second impedance for a time of successive approximation, and
wherein at the time of sampling, a reference voltage for comparison is supplied via the first impedance unit, and at the time of successive approximation, the reference voltage for comparison is supplied via the second impedance unit.

6. The semiconductor integrated circuit device according to claim 5, wherein the first impedance unit comprises:
a first resistor having an impedance for the time of sampling; and a third switch that supplies a reference voltage for comparison to which the impedance of the first resistor is added to the second input part via the capacitance element at the time of sampling, and wherein the second impedance unit comprises:

a second resistor having an impedance for the time of successive approximation; and a fourth switch that supplies a reference voltage for comparison to which the impedance of the second resistor is added to the second input part via the capacitance element at the time of successive approximation.

7. The semiconductor integrated circuit device according to claim 6, wherein the first resistors and the third switches each of the same number as that of a plurality of sensors for outputting an analog signal, which are externally coupled to the A/D converter are provided, wherein a controller that controls the plurality of third switches is provided, wherein each of the plurality of first resistors has an impedance for each of the sensors at the time of sampling, and wherein the controller detects one sensor selected from the plurality of sensors and makes a corresponding one of the third switches operate so as to select the first resistor having the impedance for the selected sensor.

8. A semiconductor integrated circuit device having:

two or more A/D converters of a successive approximation type that perform sampling of an input signal and successive approximation to convert an analog signal to a digital signal, wherein each A/D converter comprises:

a first switch whose one of coupling parts is coupled to an input part to which an analog signal for A/D conversion is input;

a D/A converter of a charge re-distribution type that samples and holds the input analog signal for A/D conversion and outputs an analog signal for conversion;

a differential amplifier having a first input part to which an output part of the D/A converter of a charge re-distribution type is coupled and a second input part to which one of coupling parts of a capacitance element is coupled, and amplifying a differential voltage; and an impedance matching circuit that supplies a reference voltage for comparison to the second input part of the differential amplifier via the capacitance element, the impedance matching circuit configured to selectively provide a first impedance or a second impedance;

one external power supply voltage terminal to which the power supply voltage for A/D conversion is supplied; and one external reference potential terminal to which the reference potential for A/D conversion is supplied, wherein the two or more A/D converters are commonly coupled to the external reference power supply voltage terminal and the external reference potential terminal so that power is supplied to the A/D converters.

9. A semiconductor integrated circuit device having:

an A/D converter of a successive approximation type that performs sampling of an input signal and successive approximation to convert an analog signal to a digital signal, the A/D converter comprising:

a first input configured to receive a first input signal;

a signal capacitance element configured to be selectively connected to the first input;

a reference capacitance element;

a differential amplifier having a first input part connected to the signal capacitance element, a second input part connected to the reference capacitance element, and an output;

a D/A converter configured to selectively supply a converter analog signal to the first input part of the differential amplifier, via the signal capacitance element; and an impedance matching circuit configured to supply a reference voltage to the second input part of the differential amplifier, via the reference capacitance element, and further configured to selectively provide a first impedance or a second impedance;

a first switch configured to connect the first input to the signal capacitance element at a time of sampling; and a second switch configured to connect the D/A converter to the first input part of the differential amplifier at a time of successive approximation.

10. The semiconductor integrated circuit device according to claim 9, wherein:

the impedance matching circuit comprises:

a first impedance unit configured to provide the first impedance at a node of the second input part of the differential amplifier, at the time of sampling; and a second impedance unit configured to provide the second impedance at the node of the second input part of the differential amplifier, at the time of successive approximation;

the reference voltage is supplied to the node of the second input part of the differential amplifier via the first impedance unit at the time of sampling; and the reference voltage is supplied to the node of the second input part of the differential amplifier via the second impedance unit at the time of successive approximation.

11. The semiconductor integrated circuit device according to claim 10, wherein:

the first impedance unit and the second impedance unit are in electrical parallel with one another, between the reference capacitance element and the reference voltage;

the first impedance unit comprises a first resistor in electrical series with a third switch; and the second impedance unit comprises a second resistor in electrical series with a fourth switch.

12. The semiconductor integrated circuit device according to claim 9, wherein:

the impedance matching circuit comprises:

a first impedance unit configured to provide the first impedance at a node of the second input part of the differential amplifier, at the time of sampling; and a second impedance unit configured to provide the second impedance at the node of the second input part of the differential amplifier, at the time of successive approximation;

the first impedance unit and the second impedance unit are in electrical series with one another;

the first impedance unit comprises a first resistor in electrical parallel with a third switch and the reference voltage is supplied to the node of the second input part of the differential amplifier via the first resistor, at the time of sampling; and the second impedance unit comprises a second resistor in electrical parallel with a fourth switch and the reference voltage is supplied to the node of the second input part of the differential amplifier via the second resistor, at the time of successive approximation.

13. The semiconductor integrated circuit device according to claim 9, further comprising:
a rail-to-rail amplifier interposed between the first input and the first switch; and
an amplifier bypass switch connected across the rail-to-rail amplifier; wherein:
the amplifier bypass switch is off, at the time of sampling; and
the amplifier bypass switch is on, at the time of successive approximation.

14. The semiconductor integrated circuit device according to claim 9, wherein:
the impedance matching circuit is configured to take into account an impedance of an external sensor which provides the first input signal to the first input.

15. The semiconductor integrated circuit device according to claim 9, wherein:
the impedance matching circuit comprises:
a plurality of first impedance units, each of said first impedance units configured to provide a first impedance at a node of the second input part of the differential amplifier at the time of sampling, in response to a selection signal which selects only one of said first impedance units; and
a second impedance unit configured to provide the second impedance at a node of the second input part of the differential amplifier, at the time of successive approximation;
the reference voltage is supplied via a selected one of the first impedance units selected by the selection signal, at the time of sampling; and
the reference voltage is supplied via the second impedance unit, at the time of successive approximation.

16. The semiconductor integrated circuit device according to claim 15, wherein:
the plurality of first impedance units and the second impedance unit are in electrical parallel with one another, between the reference capacitance element and the reference voltage;
each of the first impedance units comprises a first resistor in electrical series with a third switch;
the second impedance unit comprises a second resistor in electrical series with a fourth switch.

17. A semiconductor integrated circuit device having an A/D converter of a successive approximation type that performs sampling of an input signal and successive approximation to convert an analog signal to a digital signal, the A/D converter comprising:
a first input configured to receive a first input signal;
a signal capacitance element configured to be selectively connected to the first input;
a reference capacitance element;
a differential amplifier having a first input part connected to the signal capacitance element, a second input part connected to the reference capacitance element, and an output;
a D/A converter configured to selectively supply a converter analog signal to the first input part of the differential amplifier, via the signal capacitance element; and
an impedance matching circuit configured to supply a reference voltage to the second input part of the differential amplifier, via the reference capacitance element, and further configured to selectively provide a first impedance or a second impedance; wherein:
the D/A converter comprises a capacitive D/A converter of a charge-redistribution type that samples and holds the input signal, the capacitive D/A converter comprising:
a plurality of component signal capacitance elements arranged in electrical parallel and together constituting said signal capacitance element;
a plurality of switches, each switch associated with a corresponding one of said plurality of component signal capacitance elements and configured to selectively connect its corresponding signal capacitance element to:
(a) the first input at the time of sampling;
(b) a high-side reference voltage; or
(c) a low-side reference voltage.

18. A semiconductor integrated circuit device having an A/D converter of a successive approximation type that performs sampling of an input signal and successive approximation to convert an analog signal to a digital signal, the A/D converter comprising:
a first input configured to receive a first input signal;
a signal capacitance element configured to be selectively connected to the first input;
a reference capacitance element;
a differential amplifier having a first input part connected to the signal capacitance element, a second input part connected to the reference capacitance element, and an output;
a D/A converter configured to selectively supply a converter analog signal to the first input part of the differential amplifier, via the signal capacitance element;
an impedance matching circuit configured to supply a reference voltage to the second input part of the differential amplifier, via the reference capacitance element, and further configured to selectively provide a first impedance or a second impedance; and
a comparator whose input is connected to the output of the differential amplifier, the comparator configured to produce a successive approximation result in response thereto.

19. A semiconductor integrated circuit device having:
a plurality of A/D converters of a successive approximation type that perform sampling of an input signal and successive approximation to convert an analog signal to a digital signal, each A/D converter comprising:
a first input configured to receive a first input signal;
a signal capacitance element configured to be selectively connected to the first input;
a reference capacitance element;
a differential amplifier having a first input part connected to the signal capacitance element, a second input part connected to the reference capacitance element, and an output;
a D/A converter configured to selectively supply a converter analog signal to the first input part of the differential amplifier, via the signal capacitance element; and
an impedance matching circuit configured to supply a reference voltage to the second input part of the differential amplifier, via the reference capacitance element, and
further configured to selectively provide a first impedance or a second impedance;
wherein said plurality of A/D converters are commonly coupled to an external reference power supply voltage terminal and commonly coupled to an external reference potential terminal.

20. A semiconductor integrated circuit device having an A/D converter of a successive approximation type that performs sampling of an input signal and successive approximation to convert an analog signal to a digital signal, the A/D converter comprising:
  a first input configured to receive a first input signal;
  a signal capacitance element configured to be selectively connected to the first input;
  a reference capacitance element;
  a differential amplifier having a first input part connected to the signal capacitance element, a second input part connected to the reference capacitance element, and an output;
  a D/A converter configured to selectively supply a converter analog signal to the first input part of the differential amplifier, via the signal capacitance element; and
  an impedance matching circuit configured to supply a reference voltage to the second input part of the differential amplifier, via the reference capacitance element, and further configured to selectively provide a first impedance or a second impedance; wherein:
  the first impedance is optimum for sampling the input signal; and
  the second impedance is optimum for successive approximation.

* * * * *